Sept. 5, 1961 J. S. SABY 2,999,195

BROAD AREA TRANSISTORS

Original Filed June 14, 1952

INVENTOR:
JOHN S. SABY,
BY Julius J. Zaskalicky
HIS ATTORNEY.

United States Patent Office 2,999,195

Patented Sept. 5, 1961

2,999,195

BROAD AREA TRANSISTORS

John S. Saby, North Syracuse, N.Y., assignor to General Electric Company, a corporation of New York Continuation of abandoned application Ser. No. 293,568, June 14, 1952. This application Aug. 13, 1956, Ser. No. 603,531

21 Claims. (Cl. 317—235)

The present invention relates to improved broad area transistors and more particularly to impurity diffused opposed dot broad area transistors. This application is a continuation of application Serial No. 293,568, filed June 14, 1952, now abandoned, and assigned to the same assignee as the present application.

In the semiconductor art, the term broad area is used to distinguish those devices in which the rectification barrier or P-N junction is of large area as compared with the area of point contact in the well-known point contact or whisker devices. The expression will be used in this manner in this application.

It is believed desirable to review briefly some background material relating to semiconductors before proceeding with the description of the present invention. Semiconductors are classified according to conduction types, namely positive or P-type, negative or N-type or intrinsic, dependent upon the predominant conduction carriers present in the semiconductor which are in turn dependent upon the predominant class of impurities present. Positive or P-type semiconductor is characterized by a predominance of positive conduction carriers or holes (deficiency of electrons) and is dependent upon the presence of one or more impurities of the acceptor class. Impurities of this class include such materials as boron, aluminum, gallium and indium or alloys of these materials. Negative or N-type germanium is characterized by a predominance of negative conduction carriers or electrons and is dependent upon the presence of impurities of the donor class. The donor impurities include such materials as phosphorus, arsenic and antimony. Intrinsic semiconduction, neither positive nor negative, is dependent upon a very high degree of purity or the presence of donor and acceptor impurities in amounts which result in a balance between the positive and negative conduction carriers.

Transistors of the broad area type have been provided and they include three different regions of semiconductor known as the emitter, the base and the collector. The base is of one conduction type and the emitter and collector are of the opposite conduction type. My invention involves the provision of an improved geometry and impurity distribution in a broad area transistor and an improved method of forming such a transistor which results in improved characteristics of the transistor particularly with respect to the value of alpha (the ratio of collector current to emitter current), high frequency performance, and the uniformity of the control action over the full area of the emitter and collector electrodes. The improved characteristics are obtained in accordance with my invention by diffusing impurities of a given class into opposed faces of a monocrystal semiconductor to such a depth that the unmodified germanium between the impurity diffused regions is substantially less than the diameter of the diffused region (in the case of a circular impurity diffused region).

Further objects and advantages of my invention may be better understood by reference to the following description taken in connection with the accompanying drawing and its scope will be pointed out in the appended claims.

In order to simplify the following description of specific embodiments of my invention, it will be assumed that the monocrystalline semiconductor is N-type germanium and that the acceptor impurities utilized to produce the P-type regions is indium. It will be readily appreciated that in its broader aspects, the invention is equally applicable to N-P-N transistor units in which the monocrystalline germanium is P-type and the impurity is selected from the donor class. It is also apparent that other impurities than indium may be used as the acceptor impurity although at the present time indium does offer a preferable acceptor impurity for commercial production.

Figure 1:
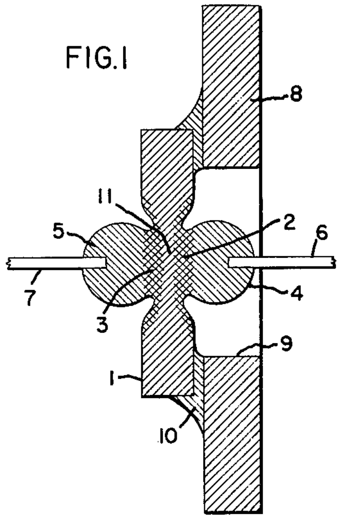
FIGURE 1 is a elevational view in section of an opposed dot transistor embodying my invention.
Figure 2:
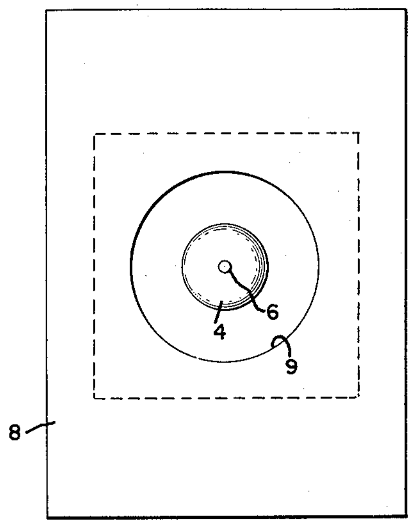
FIGURE 2 is a front elevational view of the transistor of FIGURE 1.

Referring now to FIGURES 1 and 2 of the drawing, I have shown my invention applied to a transistor including a monocrystalline wafer 1 of N-type germanium having a thickness of less than 40 mills and usually a thickness from 5 to 15 mills will be found desirable. Opposed regions 2 and 3 of P-type germanium are produced on opposite sides of the monocrystalline wafer 1 and these regions are separated by a thin region of N-type germanium, the thickness being substantially less than the diameter (in the case of circular P-type regions). In the case of other shapes of the impurity diffused region the thickness of the original conduction type germanium will be compared with the transverse dimension of that region. While in its broader aspects, transistors embodying the present invention may be produced in different ways the close control of the location of the P-type germanium that is produced by the diffusion technique described and claimed in copending application, Serial No. 187,490, filed September 29, 1950 by William C. Dunlap, Jr., now abandoned and assigned to the assignee of this application, offers a particularly effective production method. In accordance with the method therein described, impurities are diffused into the germanium by a controlled time and temperature schedule to produce the penetration desired. When produced in this manner, the P-type regions lie under the indium dots 4 and 5 which remain after the partial diffusion of the indium into the original monocrystalline wafer. Suitable contact or terminal wires 6 and 7 may be soldered into the indium at the same time that the diffusion takes place. These terminals provide the emitter and collector connections of the device.

In the illustrated embodiment, the base connection is in the form of a rectangular sheet of suitable metal such as fernico 8 provided with a circular opening 9 which surrounds one of the other electrodes and as illustrated surrounds the collector electrode or impurity dot 4. The base connection 8 is joined to the germanium wafer by means of a suitable solder 10. While it is only necessary to provide an ohmic contact between the base connection and the germanium crystal, it is desirable to use a solder which will not disturb the conduction characteristics of the wafer which in this case has been considered to be N-type. Accordingly, a solder including a donor type of impurity such as antimony may be used to advantage.

As illustrated in the drawing, a region 11 of the original monocrystalline wafer 1 between the P-type regions 2 and 3 is of small dimension compared to the area of the P-type regions and specifically this area may have a thickness in the order of 1/10 to 1/100 the diameter of the P-N junction where circular junctions are formed. In terms of actual dimensions, this means that a separation between the junctions may be in the order of 1 mil, for example.

The improved impurity distribution resulting from the impurity diffusing results in low resistivity in both the emitter and collector regions. In the emitter region, this results in good carrier injection and in the collector region, this results in a reduction in the unwanted multiplication of carriers with increases in temperature. The relatively uniform separation of the junctions provides a good high frequency characteristic since practically all of the paths of carriers from the emitter to the collector are of uniform length. This construction of a broad area transistor also facilitates connection of the base electrode which may be made either to the edge or to either of the opposed faces of the monocrystal outside of the junction area. The bonding of the base electrode to the wafer is readily made without disturbing the P-N junctions and at a distance sufficiently removed from them to prevent any interference with the paths between the emitter and collector. Obviously, the closeness of the base electrode to the P-N junctions is governed by the base resistance desired. The closer the base electrode is to the P-N junctions, the smaller is the base resistance.

Figure 3:
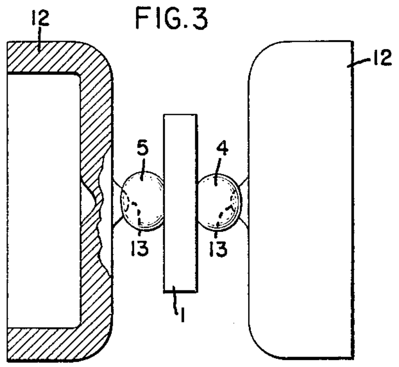
FIGURE 3 is an elevational view partially in section illustrating a modification of the device of FIGURE 1.

It is also easy to attach adequate cooling to both the emitter and collector and a modification of my invention showing this feature is illustrated in FIGURE 3. The transistor itself is essentially the same as shown in FIGURE 1. The transistor itself is essentially the same as shown in FIGURE 1 and the same reference numerals have been used to designate corresponding parts. In addition to the parts enumerated in FIGURE 1, a cooling fin in the form of a sheet metal disc 12 is attached to each of the impurity dots 4 and 5. These discs are indented in the region of the dot as shown at 13 to facilitate attachment by soldering and extend radially outwardly any desired distance. These may to advantage form the part of the enclosing case in a manner somewhat similar to the enclosure provided for broad area rectifying devices in accordance with the invention described and claimed in United States Patent 2,745,044, assigned to the assignee of this invention.

Figure 4:
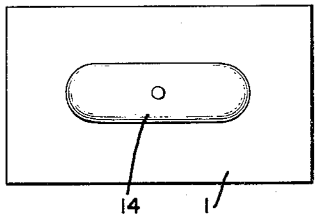
FIGURE 4 is a top-plan view of a modified form of my invention.
Figure 5:
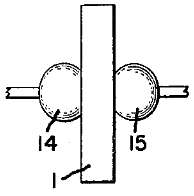
FIGURE 5 is an end elevational view of the device shown in FIGURE 4.

In FIGURE 4, I have shown a modification of my invention in which elongated emitter and collector regions 14 and 15 are provided by diffusing impurities into the monocrystal germanium wafer 1.

Figure 6:
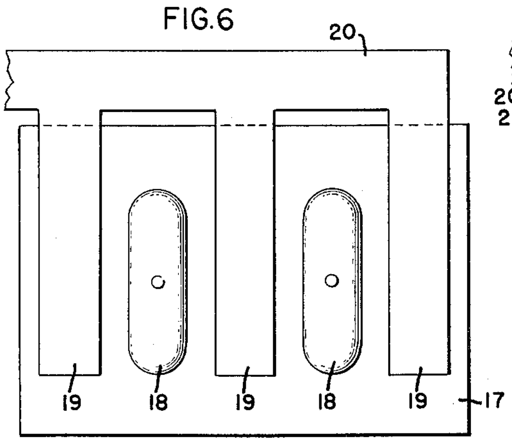
FIGURE 6 is a top plan view of a still further modification.
Figure 7:
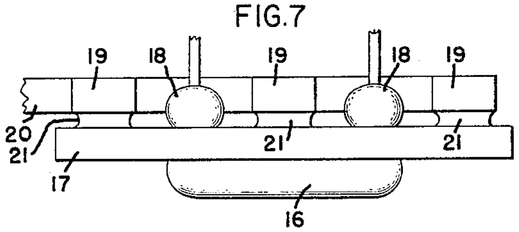
FIGURE 7 is an end elevational view of the modification shown in FIGURE 6.

In FIGURES 6 and 7 is shown a modification of my invention in which a large area collector electrode is provided by diffusing an impurity 16 into essentially the entire area of one face of the germanium crystal 17 and a plurality of elongated emitter contacts and regions is provided in the opposite face as shown at 18. Between the emitter electrodes are a plurality of conducting elements 19 which may be joined together by a conductor 20 and provide the base connection. These elements may be of fernico and attached by a suitable solder 21 having in mind the same considerations as described in connection with the attachment of the base connection 8 in connection with the modification in FIGURE 1. The arrangement shown in FIGURES 6 and 7 provides a very large collector electrode which can be readily cooled either by the attachment of fins or by a suitable liquid cooling arrangement. Since the collector electrode is the one at which the greatest heat is generated, this construction provides a very desirable one from the standpoint of heat dissipation.

In the foregoing specification and in the appended claims, the expression "diffused impurity" is used to denote impurity that is introduced into a particular region of a germanium crystal by the application of heat insufficient to melt the germanium per se even though some melting of the germanium may take place in the impurity rich region.

While I have shown and described particular embodiments of my invention, it will be apparent to those skilled in the art that changes and modifications may be made without departing from my invention in its broader aspects and I aim therefore in the appended claims to cover all such changes and modifications as fall within the true spirit and scope of my invention.

What I claim as new and desire to secure by Letters Patent of the United States is:

1. In combination, a wafer of monocrystalline germanium of one conduction type having opposed faces separated by a thickness less than 40 mils, an impurity diffused region on each face of said crystal and extending into said crystal so that the thickness of germanium of said one conduction type between the regions is substantially less than the transverse dimension of said impurity diffused regions to provide two rectification junctions therein, at least one of said impurity diffused regions having an area substantially less than the area of the opposed face to leave a marginal position of the original conduction type surrounding said one impurity diffused region, and a base electrode connected to said marginal portion.

2. A broad area transistor comprising a base electrode layer of crystalline semiconductor material of a first conductivity type and having opposed faces, a plurality of paralleled emitter electrodes spaced on one of said faces of said base electrode layer, a plurality of parallel conducting elements positioned between said emitter electrodes and connected to said base electrode layer, and a collector electrode contiguous with the other face of said base electrode layer and having a large area relative to the area of each of said emitter electrodes so that a portion of said collector electrode is opposite each of said paralleled emitter electrodes.

3. A board area transistor comprising a layer of semiconductor material of a first conductivity type and having opposed faces, dots of impurity material selected from a class which characterizes semiconductor material of opposite conductivity type from said first conductivity type positioned on said opposed faces and diffused therein to provide opposed layers of semiconductor material of said opposite conductivity type separated by an intermediate layer of semiconductor material of said first type, means for attaching conductors to said opposed layers thereby to provide emitter and collector connections, a base connection comprising a metallic sheet having a central aperture therein for receiving one of said dots, and means for attaching said metallic sheet to said layer of semiconductor material of said first conductivity type.

4. A board area transistor comprising a wafer of semiconductor material of a first conductivity type and having opposed faces, dots of impurity material positioned on said opposed faces of said wafer and of an impurity type which characterizes semiconductor material of opposite conductivity type from said wafer, portions of said impurity material being introduced into said wafer to form regions of semiconductor material of opposite conductivity type from said first conductivity type separated by a layer of semiconductor material of said first conductivity type, cooling fins of a conductive material, means for attaching said cooling fins to said dots to provide emitter and collector connections, a base connection comprising a metallic disc having a central aperture therein, and means for attaching said metallic disc to said wafer of semiconductor material so that one of said dots extends into said aperture without contacting the sides thereof.

5. A junction transistor comprising a base wafer of semiconductor material of a first conductivity type and having opposed faces, an emitter electrode including a plurality of impurity elements spaced on one of said opposed faces, said impurity elements being of a material characteristic of semiconductor material of opposite conductivity type from said first conductivity type, a portion of said impurity element being introduced into said wafer to form regions of semiconductor material of opposite conductivity type from said base wafer beneath said impurity elements, conducting elements positioned between said emitter elements and connected to said base wafer, and a collector electrode layer contiguous with the other one of said opposed faces and of semiconductor material of opposite conductivity type from said base wafer.

6. A junction transistor comprising a base wafer of crystalline semiconductor material of a first conductivity type and having opposed faces, an emitter electrode including a plurality of impurity elements spaced on one of said opposed faces, said impurity elements being of a material characteristic of semiconductor material of opposite conductivity type from said first conductivity type, a portion of each of said impurity elements being introduced into said wafer to form region of semiconductor material of opposite conductivity type from said base wafer beneath said impurity elements, conducting elements positioned between said emitter elements and connected to said base wafer, and a collector electrode layer contiguous with the other one of said opposed faces and of semiconductor material of opposite conductivity type from said base wafer, said collector electrode being larger in area than said emitter electrode.

7. A broad area transistor comprising a wafer of semiconductor material of a first conductivity type having opposed faces, dots of impurity material positioned on said opposed faces of said wafer of an impurity type which characterizes semiconductor material of opposite conductivity type from said wafer, portions of said impurity material being introduced into said wafer to form regions of semiconductor material of opposite conductivity type from said first conductivity type separated by a layer of semiconductor material of said first conductivity type, a cooling fin of a conductive material, means for attaching said cooling fin to one of said dots to provide an emitter connection, means connected to the other of said dots to provide a collector connection, and means connected to said wafer of semiconductor material to provide a base connection.

8. A broad area transistor comprising a wafer of semiconductor material of a first conductivity type having opposed faces, dots of impurity material positioned on said opposed faces of said wafer of an impurity type which characterizes semiconductor material of opposite conductivity type from said wafer, portions of said impurity material being introduced into said wafer to form regions of semiconductor material of opposite conductivity type from said first conductivity type separated by a layer of semiconductor material of said first conductivity type, a cooling fin of conductive material, means for attaching said cooling fin to one of said dots to provide a collector connection, means connected to the other of said dots to provide an emitter connection, and means connected to said wafer of semiconductor material to provide a base connection.

9. A broad area transistor comprising a base layer of semiconductor material of one conductivity type having opposed faces, an elongated emitter layer contiguous with one face of said base layer and of semiconductor material of opposite conductivity type, an elongated base electrode connected to said one face of said base layer in parallel relationship to said emitter layer, and a collector layer of semiconductor material of said opposite conductivity type in opposed relation to said emitter layer and contiguous with the opposite face of said base layer.

10. A broad area transistor comprising a wafer of crystal semiconductor material of one conductivity type having opposed faces, a first elongated element of impurity material characteristic of semiconductor material of opposite type from said wafer of said semiconductor material and continguous with one side of said wafer, a portion of the impurity material of said element being introduced into said wafer of semiconductor material to form an emitter electrode, an elongated base electrode connected to said one side of said wafer in parallel relationship to said emitter electrode and another element of impurity material characteristic of semiconductor material of opposite type in opposed relationship to said emitter electrode and contiguous with the opposite face of said wafer of said semiconductor material, a portion of the impurity material of said other element being introduced into said wafer of semiconductor material to form a collector electrode.

11. A junction transistor comprising a base wafer of semiconductor material of a first conductivity type having opposed faces, an emitter electrode including a plurality of impurity elements spaced on one of said opposed faces, said impurity elements being of a material characteristic of semiconductor material of opposite conductivity type from said first conductivity type, a portion of said impurity element being introduced into said wafer to form regions of semiconductor material of opposite conductivity type from said base wafer beneath said impurity elements, conductor elements positioned between said emitter elements and connected to said base wafer and to each other, and a collector layer contiguous with the other one of said opposed faces and of semiconductor material of opposite conductivity type from said base wafer.

12. A junction transistor comprising a wafer of semiconductor material of one conductivity type having opposed major faces and having at one major face thereof a layer of opposite conductivity type and at the other major face a discrete region of opposite conductivity type, a collector contact to said layer, and emitter contact to said discrete region, and a base contact laterally surrounding, and in close proximity to, said emitter contact and contacting said other major face of said one conductivity type wafer.

13. A junction transistor comprising a wafer of semiconductive material of one conductivity type having opposed major surfaces, a first opposite conductivity type inducing electrode contacting one major surface of said wafer, a second opposite conductivity type inducing electrode contacting a portion of the opposite major surface of said wafer and a base electrode in good conductive contact with a portion of said opposite major surface of said wafer laterally surrounding, and in close proximity to, said second opposite conductivity type inducing electrode.

14. A junction transistor comprising a wafer of semiconductive material of one conductivity type having opposed major surfaces, a first opposite conductivity type inducing electrode contacting one major surface of said wafer and inducing therein a surface adjacent region of opposite conductivity type, a second opposite conductivity type inducing electrode contacting a portion of the opposite major surface of said wafer and inducing therein a surface adjacent region of opposite conductivity type, and a base electrode laterally surrounding said second opposite conductivity type inducing electrode in close proximity thereto and making good conductive contact with said opposite major surface of said one conductivity type wafer.

15. A semiconductor device comprising a body of semiconductor material, a P-N junction present beneath each of two opposite surfaces of said body, and an electrode bonded in annular contact to one surface of the N-type portion of said body and surrounding one of said junctions substantially as closely as its adherence to only the N-type portion of the body will permit.

16. A semiconductor device comprising a body of semiconductive material, a pair of rectifying barriers of the area type, such as of the alloy junction type, in cooperative relationship in said body, said barriers being disposed one adjacent to each of two opposite surfaces of said body, and a non-rectifying electrode bonded in annular contact to one surface of said body, said electrode closely surrounding and being disposed entirely outside one of said barriers.

17. A semiconductor device comprising a body of P-type semiconductive material, first and second area type rectifying electrodes disposed one upon each of two opposite surfaces of said body, each of said electrodes forming a P-N rectifying junction in said body, and a third non-rectifying electrode bonded in annular contact to one surface of said body, said third electrode closely surrounding and being disposed entirely outside of the P-N rectifying junction formed by one of said rectifying electrodes.

18. A semiconductor device comprising a body of N-type semiconductive material, first and second area type rectifying electrodes disposed one upon each of two opposite surfaces of said body, each of said electrodes forming a P-N rectifying junction in said body, and a third non-rectifying electrode bonded in annular contact to one surface of said body, said third electrode closely surrounding and being disposed entirely outside of the P-N rectifying junction formed by one of said rectifying electrodes.

19. A semiconductor device comprising a body of N-type semiconductive germanium, first and second area type rectifying electrodes surface alloyed one upon each of two opposite surfaces of said body and forming a pair of P-N rectifying junctions in said body, and a third non-rectifying electrode bonded to said body, said third electrode closely surrounded and being disposed entirely outside of the P-N rectifying junction formed by one of said rectifying electrodes.

20. A junction transistor comprising a wafer of semiconductive material of one conductivity type having opposed major faces and having at one major face thereof a first region of opposite conductivity type and at the other major face thereof a second region of opposite conductivity type, a collector contact to said first region, and emitter contact to said second region, and a base contact laterally surrounding and in close proximity to said emitter contact and contacting the main body of said one conductivity type wafer.

21. A junction transistor comprising a wafer of semiconductor material of one conductivity type having a pair of opposed major faces and having adjacent one major face thereof an emitter region of opposite conductivity type and adjacent the other major face thereof a collector region of opposite conductivity type, said emitter region being of elongated configuration, a base contact of elongated configuration in said one face of said wafer having the long dimension thereof in close proximity to the long dimension of said emitter region.

References Cited in the file of this patent

UNITED STATES PATENTS

| | | |
|---|---|---|
| 2,651,009 | Meyer | Sept. 1, 1953 |
| 2,666,814 | Shockley | Jan. 19, 1954 |
| 2,754,455 | Pankove | July 10, 1956 |
| 2,771,382 | Fuller | Nov. 20, 1956 |
| 2,790,037 | Shockley | Apr. 23, 1957 |